United States Patent
Kitano

(10) Patent No.: US 11,394,193 B2
(45) Date of Patent: Jul. 19, 2022

(54) POWER SUPPLY SYSTEM, POWER SUPPLY SYSTEM CONTROL METHOD, AND CIRCUIT BOARD

(71) Applicant: NEC Platforms, Ltd., Kawasaki (JP)

(72) Inventor: Masaaki Kitano, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 432 days.

(21) Appl. No.: 16/482,729

(22) PCT Filed: Jan. 4, 2018

(86) PCT No.: PCT/JP2018/000011
§ 371 (c)(1),
(2) Date: Aug. 1, 2019

(87) PCT Pub. No.: WO2018/146980
PCT Pub. Date: Aug. 16, 2018

(65) Prior Publication Data
US 2021/0288486 A1  Sep. 16, 2021

(30) Foreign Application Priority Data
Feb. 10, 2017 (JP) .............................. JP2017-023563

(51) Int. Cl.
*H02H 3/00* (2006.01)
*H02H 3/087* (2006.01)
(Continued)

(52) U.S. Cl.
CPC ....... *H02H 3/087* (2013.01); *G01R 19/16538* (2013.01); *H02J 1/00* (2013.01)

(58) Field of Classification Search
None
See application file for complete search history.

(56) References Cited

U.S. PATENT DOCUMENTS 6,879,477 B2 * 4/2005 Stahuber ................ B64D 41/00
  361/91.4
9,966,675 B2 * 5/2018 Wortberg ............... H01R 9/226

FOREIGN PATENT DOCUMENTS

| JP | H05-055730 U | 7/1993 |
| JP | H07-184369 A | 7/1995 |

(Continued)

OTHER PUBLICATIONS

International Search Report for PCT Application No. PCT/JP2018/000011, dated Feb. 6, 2018.
(Continued)

*Primary Examiner* — Stephen W Jackson
(74) *Attorney, Agent, or Firm* — Sughrue Mion, PLLC

(57) ABSTRACT

A power supply system includes a first circuit board mounting a power source circuit and an electronic fuse and a second circuit board mounting a power consumption circuit and a switch. When the electronic fuse detects an overcurrent due to a failure occurring in the power consumption circuit, the power supply system immediately cuts out an overcurrent flowing through the power consumption circuit while changing the switch from an open state to a short-circuited state according to a fault signal output from the electronic fuse. Accordingly, it is possible to safely separate the first circuit board and the second circuit board, and therefore it is possible to replace the second circuit board with another circuit board mounting a normal power consumption circuit.

3 Claims, 5 Drawing Sheets

(51) Int. Cl.
    *G01R 19/165*    (2006.01)
    *H02J 1/00*     (2006.01)

(56) References Cited

FOREIGN PATENT DOCUMENTS

| JP | 2000-041330 A | 2/2000 |
| JP | 2001-309546 A | 11/2001 |
| JP | 2009-118655 A | 5/2009 |
| JP | 2011-131708 A | 7/2011 |
| JP | 2012-115094 A | 6/2012 |
| JP | 2016-060427 A | 4/2016 |

OTHER PUBLICATIONS

Japanese Office Action for JP Application No. 2017-023563 dated Dec. 18, 2018 with English Translation.

\* cited by examiner

POWER SUPPLY SYSTEM, POWER SUPPLY SYSTEM CONTROL METHOD, AND CIRCUIT BOARD

TECHNICAL FIELD

The present invention relates to a power supply system, a power supply system control method, and a circuit board.

This application is a National Stage Entry of PCT/JP2018/000011 filed on Jan. 4, 2018, which claims priority from Japanese Patent Application 2017-023563 filed on Feb. 10, 2017, the contents of all of which are incorporated herein by reference, in their entirety.

BACKGROUND ART

Conventionally, various types of electric appliances and electronic devices have been equipped with power source circuits for applying power thereto. For example, Patent Document 1 discloses a power source circuit having an overcurrent protection circuit to supply power to an electric appliance such as a television receiver set. As a protection device configured to cope with an overcurrent due to an erroneous operation of a load, it is possible to use a reset-type fuse to realize restoration from an error in a power source circuit. Patent Document 2 discloses an in-vehicle power supply system to supply power to electrical parts using a generator or a battery mounted on a vehicle. In this connection, semiconductor switching devices are equipped with electronic fuses to cut out output currents which may occur due to errors.

CITATION LIST

Patent Document

Patent Document 1: Japanese Patent Application Publication No. 2000-41330
Patent Document 2: Japanese Patent Application Publication No. 2016-60427

SUMMARY OF INVENTION

Technical Problem

When a failure occurs in any one of a plurality of power consumption circuits (or loads), which may consume power supplied by a power source circuit, in a power supply system, the power source circuit may cause a large amount of current to flow through the power consumption circuit causing a failure. In this case, it is preferable that a large amount of current flowing through the power consumption circuit be immediately cut out in order to prevent power from being wastefully consumed and that the power consumption circuit causing a failure be replaced with another power consumption circuit securing a normal operation while other power consumption circuits not causing a failure be maintained in operating conditions.

The present invention aims to provide a power supply system, a power supply system control method, and a circuit board which can solve the above problem.

Solution to Problem

A first aspect of the invention is directed to a power supply system including a power source circuit, an electronic fuse configured to output the power supplied by the power source circuit according to a voltage applied to a first terminal while generating a predetermined signal at a second terminal according to an amount of current which occurs based on the power of the power source circuit, a power consumption circuit configured to consume the power supplied by the power source circuit via the electronic fuse, and a switch configured to be changed in the connected state with the electronic fuse according to the predetermined signal generated at the second terminal of the electronic fuse. Herein, the power source circuit and the electronic fuse are mounted on a first circuit board while the power source circuit and the switch are mounted on a second circuit board, wherein the first circuit board is connected to the second circuit board through a connector.

A second aspect of the invention is directed to a circuit board including a power source circuit configured to consume the power supplied by a power source circuit via an electronic fuse, and a switch configured to be changed in the connected state with the electronic fuse according to a predetermined signal output from the electronic fuse.

A third aspect of the invention is directed to a control method applied to a power supply system including a power source circuit, an electronic fuse, a power consumption circuit, and a switch. The control method includes the steps of: supplying the power to the power consumption circuit from the power source circuit via the electronic fuse according to a voltage applied to a first terminal of the electronic fuse; generating a predetermined signal at a second terminal of the electronic fuse according to an amount of current occurring based on the power of the power source circuit; and changing the connected state of the switch according to the predetermined signal generated at the second terminal of the electronic fuse.

Advantageous Effects of Invention

According to the present invention, even when any one of power consumption circuits (or loads), which may consume power supplied by a power source circuit, invites a failure to cause an overcurrent flowing therethrough, it is possible to immediately cut out an overcurrent flowing through the power consumption circuit causing a failure, and therefore it is possible to replace the power consumption circuit causing a failure with another power consumption circuit securing a normal operation while maintaining other power consumption circuits not causing a failure in operating conditions.

DESCRIPTION OF EMBODIMENTS

A power supply system of the present invention will be described in detail by way of examples with reference to the accompanying drawings.

Figure 1:
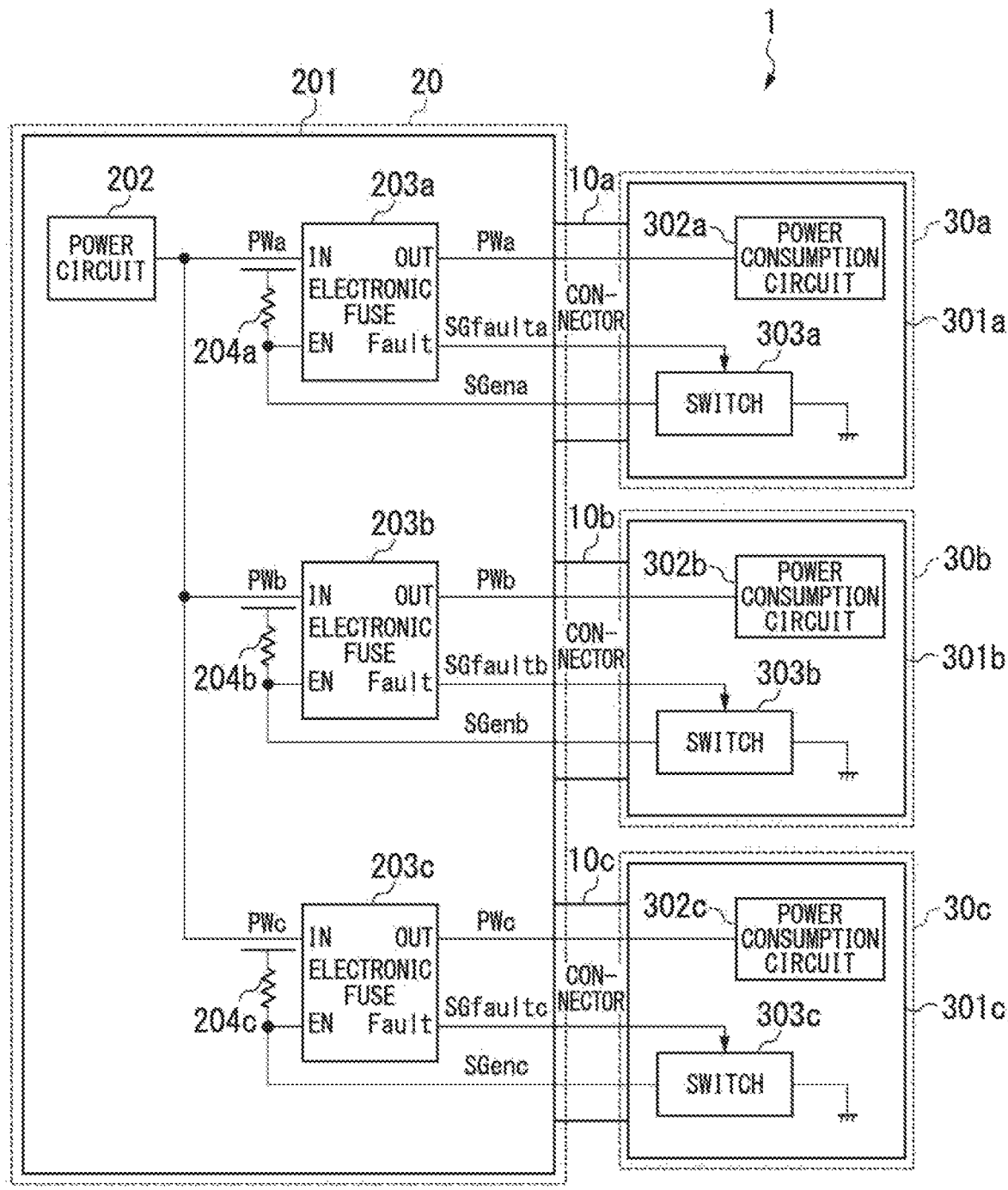
FIG. 1 is a block diagram of a power supply system according to one embodiment of the present invention.

FIG. 1 is a block diagram of a power supply system 1 according to one embodiment of the present invention. The power supply system 1 includes connectors 10a, 10b, 10c, a module 20, and modules 30a, 30b, 30c. Hereinafter, the connectors 10a, 10b, 10c will be collectively referred to as connectors 10. In addition, the modules 30a, 30b, 30c will be collectively referred to as modules 30.

The connector 10a is configured to connect the module 20 and the module 30a. The module 20 produces power PWa which is supplied to the module 30a via the connector 10a. An enable signal SGena output from an enable terminal EN in the module 20 is supplied to the module 30a via the connector 10a. A fault signal SGfaulta output from a fault terminal Fault in the module 20 is supplied to the module 30a via the connector 10a.

The connector 10b is configured to connect the module 20 and the module 30b. The module 20 produces power PWb which is supplied to the module 30b via the connector 10b. An enable signal SGenb output from an enable terminal EN in the module 20 is supplied to the module 30b via the connector 10b. A fault signal SGfaultb output from a fault terminal Fault in the module 20 is supplied to the module 30b via the connector 10b.

The connector 10c is configured to connect the module 20 and the module 30c. The module 20 produces power PWc which is supplied to the module 30c via the connector 10c. An enable signal SGenc output from an enable terminal EN in the module 20 is supplied to the module 30c via the connector 10c. A fault signal SGfaultc output from a fault terminal Fault in the module 20 is supplied to the module 30c via the connector 10c.

The module 20 includes a first circuit board 201, a power source circuit 202, electronic fuses 203a, 203b, 203c, and resistors 204a, 204b, 204c. Hereinafter, the electronic fuses 203a, 203b, 203c will be collectively referred to as electronic fuses 203. In addition, the resistors 204a, 204b, 204c will be collectively referred to as resistors 204.

The power source circuit 202, a plurality of electronic fuses 203, and a plurality of resistors 204 are mounted on the first circuit board 201.

The power source circuit 202 supplies power to a second circuit board 301a through the electronic fuse 203a and the connector 10a. The power source circuit 202 supplies power to a second circuit board 301b through the electronic fuse 203b and the connector 10b. The power source circuit 202 supplies power to a second circuit board 301c through the electronic fuse 203c and the connector 10c.

Each electronic fuse 203 is configured to electrically cut out its internal circuit therein; however, it may restore the internal circuit in an electrically connected state again due to an event of cutting out power supplied to each electronic fuse 203 once the internal circuit is cut out. As concrete examples of the electronic fuses 203, for example, "TPS26600" manufactured by Texas Instruments Inc. and "ADG841" manufactured by Analog Devices Inc. can be mentioned.

The electronic fuse 203a is installed to protect the module 30a from an overcurrent. The electronic fuse 203a has an input terminal IN, an output terminal OUT, an enable terminal EN, and a fault terminal Fault. Upon detecting an overcurrent exceeding an allowable current in the internal circuit, the electronic fuse 203a outputs a fault signal SGfaulta, representing the detection of an overcurrent, from the fault terminal Fault.

Upon being supplied with a voltage at the enable terminal EN in an asserted state, i.e. a high-level voltage indicating an operable condition, the electronic fuse 203a establishes a conducted state of the internal circuit between the input terminal IN and the output terminal OUT. Upon being supplied with a voltage at the enable terminal EN in a de-asserted state, i.e. a low-level signal indicating an operation-inhibited condition, the electronic fuse 203a establishes a cutout state of the internal circuit between the input terminal IN and the output circuit OUT. In the cutout state of the internal circuit, the power source circuit 202 stops supplying the power PWa to the electronic fuse 203a. When the power source circuit 202 resumes to supply the power PWa to the electronic fuse 203a, the input terminal IN and the output terminal OUT will be electrically connected.

The electronic fuse 203b is installed to protect the module 30b from an overcurrent. The electronic fuse 203b has an input terminal IN, an output terminal OUT, an enable terminal EN, and a fault terminal Fault. Upon detecting an overcurrent exceeding an allowable current in the internal circuit, the electronic fuse 203b outputs a fault signal SGfaultb, representing the detection of an overcurrent, from the fault terminal Fault.

Upon being supplied with a voltage at the enable terminal EN in an asserted state, i.e. a high-level voltage indicating an operable condition, the electronic fuse 203b establishes a conducted state of the internal circuit between the input terminal IN and the output terminal OUT. Upon being supplied with a voltage at the enable terminal EN in a de-asserted state, i.e. a low-level signal indicating an operation-inhibited condition, the electronic fuse 203b establishes a cutout state of the internal circuit between the input terminal IN and the output circuit OUT. In the cutout state of the internal circuit, the power source circuit 202 stops supplying the power PWb to the electronic fuse 203b. When the power source circuit 202 resumes to supply the power PWb to the electronic fuse 203b, the input terminal IN and the output terminal OUT will be electrically connected.

The electronic fuse 203c is installed to protect the module 30c from an overcurrent. The electronic fuse 203c has an input terminal IN, an output terminal OUT, an enable terminal EN, and a fault terminal Fault. Upon detecting an overcurrent exceeding an allowable current in the internal circuit, the electronic fuse 203c outputs a fault signal SGfaultc, representing the detection of an overcurrent, from the fault terminal Fault.

Upon being supplied with a voltage at the enable terminal EN in an asserted state, i.e. a high-level voltage indicating an operable condition, the electronic fuse 203c establishes a conducted state of the internal circuit between the input terminal IN and the output terminal OUT. Upon being supplied with a voltage at the enable terminal EN in a de-asserted state, i.e. a low-level signal indicating an operation-inhibited condition, the electronic fuse 203c establishes a cutout state of the internal circuit between the input terminal IN and the output circuit OUT. In the cutout state of the internal circuit, the power source circuit 202 stops supplying the power PWc to the electronic fuse 203c. When the power source circuit 202 resumes to supply the power PWc to the electronic fuse 203c, the input terminal IN and the output terminal OUT will be electrically connected.

No current may flow through the resistor 204a in an open state (or an OFF state) of the switch 303a of the module 30a. Due to the open state of the switch 303a, the resistor 204a makes a pull-up state for the enable terminal EN of the electronic fuse 203a, i.e. a high-level voltage is applied to the enable terminal EN. On the other hand, a current may flow through the resistor 204a in a short-circuited state (or an ON state) of the switch 303a. At this time, a voltage drop may occur in the resistor 204a, and therefore the enable terminal EN of the electronic fuse 203a is short-circuited to a ground GND (i.e. a low-level signal).

No current may flow through the resistor 204b in an open state (or an OFF state) of the switch 303b of the module 30b. Due to the open state of the switch 303b, the resistor 204b makes a pull-up state for the enable terminal EN of the electronic fuse 203b, i.e. a high-level voltage is applied to the enable terminal EN. On the other hand, a current may flow through the resistor 204b in a short-circuited state (or an ON state) of the switch 303b. At this time, a voltage drop may occur in the resistor 204b, and therefore the enable terminal EN of the electronic fuse 203b is short-circuited to a ground GND (i.e. a low-level signal).

No current may flow through the resistor 204c in an open state (or an OFF state) of the switch 303c of the module 30c. Due to the open state of the switch 303c, the resistor 204c makes a pull-up state for the enable terminal EN of the electronic fuse 203c, i.e. a high-level voltage is applied to the enable terminal EN. On the other hand, a current may flow through the resistor 204c in a short-circuited state (or an ON state) of the switch 303c. At this time, a voltage drop may occur in the resistor 204c, and therefore the enable terminal EN of the electronic fuse 203b is short-circuited to a ground GND (i.e. a low-level signal).

The module 30a includes a second circuit board 301a, a power consumption circuit 302a, and a switch 303a. The power consumption circuit 302a and the switch 303a are mounted on the second circuit board 301a. The power consumption circuit 302a may operate with power supplied by the power source circuit 202, and therefore the power consumption circuit 302a may serve as a load for consuming power of the power source circuit 202. For example, the power consumption circuit 302a corresponds to any circuitry consuming a large amount of power such as a CPU and a memory.

The switch 303a having a non-volatile memory area is configured to hold a value previously stored therein irrespective of stoppage of power supply to the switch 303a. One terminal of the switch 303a is grounded to the ground GND. Another terminal of the switch 303a is connected to the enable terminal EN of the electronic fuse 203a through the connector 10a.

In an initial condition not to receive the signal SGfaulta from the fault terminal Fault of the electronic fuse 203a, the switch 303a establishes an open state between the ground GND and the enable terminal EN of the electronic fuse 203a. In a condition to receive the signal SGfaulta from the fault terminal Fault of the electronic fuse 203a, the switch 303a establishes a short-circuited state between the ground GND and the enable terminal EN of the electronic fuse 203a. Since the switch 303a has the non-volatile memory area configured to hold the previously-stored value irrespective of the cutout of power supply, the switch 303a may normally hold a short-circuited state between the ground GND and the enable terminal EN of the electronic fuse 203a after receiving the fault signal SGfaulta from the fault terminal Fault of the electronic fuse 203a.

The module 30b includes a second circuit board 301b, a power consumption circuit 302b, and a switch 303b. The power consumption circuit 302b and the switch 303b are mounted on the second circuit board 301b. The power consumption circuit 302b may operate with power supplied by the power source circuit 202, and therefore the power consumption circuit 302b may serve as a load for consuming power of the power source circuit 202.

The switch 303b having a non-volatile memory area is configured to hold a value previously stored therein irrespective of stoppage of power supply to the switch 303b. One terminal of the switch 303b is grounded to the ground GND. Another terminal of the switch 303b is connected to the enable terminal EN of the electronic fuse 203b through the connector 10b.

In an initial condition not to receive the signal SGfaultb from the fault terminal Fault of the electronic fuse 203b, the switch 303b establishes an open state between the ground GND and the enable terminal EN of the electronic fuse 203b. In a condition to receive the signal SGfaultb from the fault terminal Fault of the electronic fuse 203b, the switch 303b establishes a short-circuited state between the ground GND and the enable terminal EN of the electronic fuse 203b. Since the switch 303b has the non-volatile memory area configured to hold the previously-stored value irrespective of the cutout of power supply, the switch 303b may normally hold a short-circuited state between the ground GND and the enable terminal EN of the electronic fuse 203b after receiving the fault signal SGfaultb from the fault terminal Fault of the electronic fuse 203b.

The module 30c includes a second circuit board 301c, a power consumption circuit 302c, and a switch 303c. The power consumption circuit 302c and the switch 303 are mounted on the second circuit board 301c. The power consumption circuit 302c may operate with power supplied by the power source circuit 202, and therefore the power consumption circuit 302c may serve as a load for consuming power of the power source circuit 202.

The switch 303c having a non-volatile memory area is configured to hold a value previously stored therein irrespective of stoppage of power supply to the switch 303c. One terminal of the switch 303c is grounded to the ground GND. Another terminal of the switch 303c is connected to the enable terminal EN of the electronic fuse 203c through the connector 10c.

In an initial condition not to receive the signal SGfaultc from the fault terminal Fault of the electronic fuse 203c, the switch 303c establishes an open state between the ground GND and the enable terminal EN of the electronic fuse 203c. In a condition to receive the signal SGfaultc from the fault terminal Fault of the electronic fuse 203c, the switch 303c establishes a short-circuited state between the ground GND and the enable terminal EN of the electronic fuse 203c. Since the switch 303c has the non-volatile memory area configured to hold the previously-stored value irrespective of the cutout of power supply, the switch 303c may normally hold a short-circuited state between the ground GND and the enable terminal EN of the electronic fuse 203c after receiving the fault signal SGfaultc from the fault terminal Fault of the electronic fuse 203c.

Figure 2:
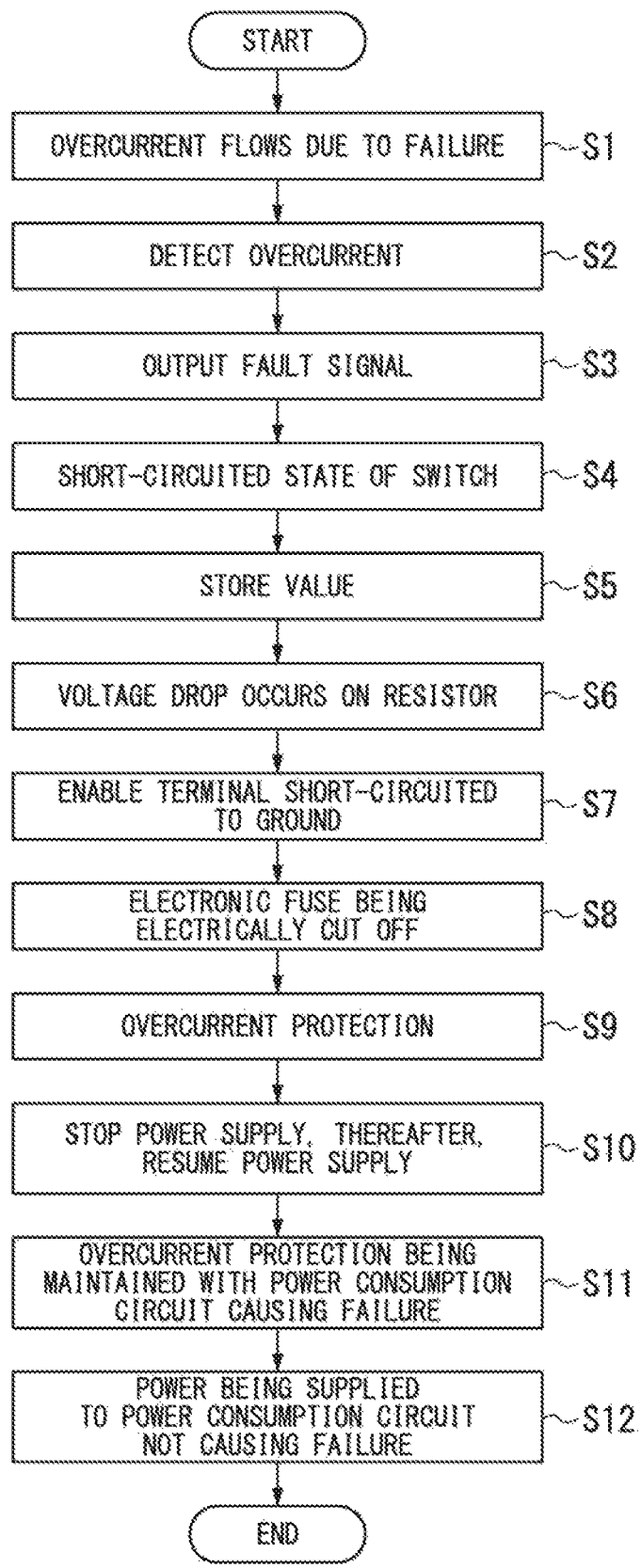
FIG. 2 is a flowchart showing a procedure of the power supply system according to one embodiment of the present invention.

Next, the procedure of the power supply system 1 according to one embodiment of the present invention will be described. The following description refers to the flowchart shown in FIG. 2 with respect to the procedure of the power supply system 1 on the condition that the power consumption circuit 302a among multiple power consumption circuits 302 invites a failure to cause an overcurrent flowing therethrough. Hereinafter, the switch 303a, 303b, 303c will be collectively referred to as switches 303.

First, an overcurrent may flow through the power consumption circuit 302a (step S1). When an overcurrent flows through the power consumption circuit 302a, the electronic fuse 203a detects the overcurrent with its internal circuit (step S2). Upon detecting the overcurrent, the electronic fuse 203a outputs a fault signal SGfault at the fault terminal Fault (step S3).

The switch 303a receives the fault signal SGfault from the electronic fuse 203a. Upon receiving the fault signal SGfault, the switch 303a establishes a short-circuited state between the ground GND and the enable terminal EN of the electronic fuse 203a (step S4). At this time, the memory area of the switch 303a stores a value (e.g. "1" indicating a high level) upon receiving the fault signal SGfault (step S5). By storing this value, it is possible to hold a short-circuited state between the ground GND and the enable terminal EN of the electronic fuse 203a.

A current may flow through the resistor 204a due to a short-circuited state between the ground GND and the enable terminal EN of the electronic fuse 203a. A voltage drop may occur due to a current flowing through the resistor 204a (step S6). In addition, a voltage (i.e. a low-level voltage) causing a de-asserted state is applied to the enable terminal EN of the electronic fuse 203a, which is thus short-circuited to the ground GND (step S7).

When the enable terminal EN is short-circuited to the ground GND, the electronic fuse 203a electrically cuts out the internal circuit between the input terminal IN and the output terminal OUT (step S8).

No power is supplied to the power consumption circuit 302 since the internal circuit between the input terminal IN and the output terminal OUT of the electronic fuse 203a is electrically cut out. That is, no overcurrent may flow through the power consumption circuit 302a, as a result, it is possible to implement overcurrent protection for the power consumption circuit 302a (step S9).

Next, it is assumed that the power source circuit 202 stops power supply to each electronic fuse 203, each power consumption circuit 302, and the switches 303a, 303b, 303c, and then the power course circuit 202 resumes its power supply (step S10). At this time, the memory area of the switch 303a stores the value at the timing of receiving the fault signal SGfaulta in step S5, and therefore the short-circuited state is held between the ground GND and the enable terminal EN of the electronic fuse 203a. That is, the overcurrent protection is maintained with respect to the power consumption circuit 302a causing a failure (step S11).

The above descriptions do not refer to the switches 303b, 303c other than the switch 303a. Similar to the switch 303a having the memory area, the switches 303b and 303c have their memory areas configured to store values (e.g. a low-level value "0" indicating no flowing of overcurrent) corresponding to the fault signals SGfaultb and SGfaultc. Therefore, the switches 303b and 303c hold open states between the ground GND and the enable terminals EN of the electronic fuses 203b, 203c. That is, the power source circuit 202 supplies power to the power consumption circuits 302b and 302c other than the power consumption circuit 302a (step S12).

It is obvious from the steps S11 and S12 that the overcurrent protection is implemented with respect to the power consumption circuit 302a causing an overcurrent to flow therethrough due to a failure occurring in the power supply system 1. On the other hand, the other power consumption circuits 302b and 302c may carry out their normal operations in a period in which the power source circuit 202 supplies power thereto.

Therefore, it is possible to solely extract the module 30a including the power consumption circuit 302a causing an overcurrent to flow therethrough due to a failure and to thereby replace the power consumption circuit 302a with another power consumption circuit not causing a failure while maintaining the other modules 30b and 30c to operate normally. At this time, considering the necessity of restoring the connected state of the switch 303a holding its previous state with the ground GND to the original connected state, the switch 303a is mounted on the circuit board 301a together with the power consumption circuit 302a. As described above, it is possible to replace the module 30a having the power consumption circuit 302a, which may cause an overcurrent to flow therethrough due to a failure, with another module at once.

As described above, the power supply system 1 according to one embodiment of the present invention includes the first circuit board 201, the second circuit boards 301a, 301b, 301c, and a plurality of connectors 10a, 10b, 10c for connecting the first circuit board 201 to the second circuit boards 301. The first circuit board 201 includes the power source circuit 202, and the electronic fuses 203a, 203b, 203c, each of which supplies power from the power source circuit 202 to the circuit board 301 based on the voltage applied to the enable terminal (or a first terminal) and each of which generates a fault signal at the fault terminal Fault (or a second terminal) based on an amount of current flowing through the internal circuit. The circuit boards 301a, 301b, 301c include the power consumption circuits 302a, 302b, 302c configured to consume power supplied thereto from the power source circuit 202 as well as the switches 303a, 303b, 303c. Each switch 303 may hold the other connected state when the current connected state is changed to the other connected state (e.g. a change from the open state to the short-circuited state) responsive to a fault signal (or a predetermined signal) occurring at the fault terminal Fault of the electronic fuse 203.

Accordingly, even when a failure occurs in any one of the power consumption circuits (or loads) 302 configured to consume power supplied from the power source circuit 202, it is possible for the power supply system 1 to immediately cut out an overcurrent flowing through the power consumption circuit 302 causing a failure in order to prevent power from being wastefully consumed. In addition, it is possible to replace the power consumption circuit 302 causing a failure with another power consumption circuit securing a normal operation while maintaining other power consumption circuits 302 not causing a failure in operating state.

Figure 3:
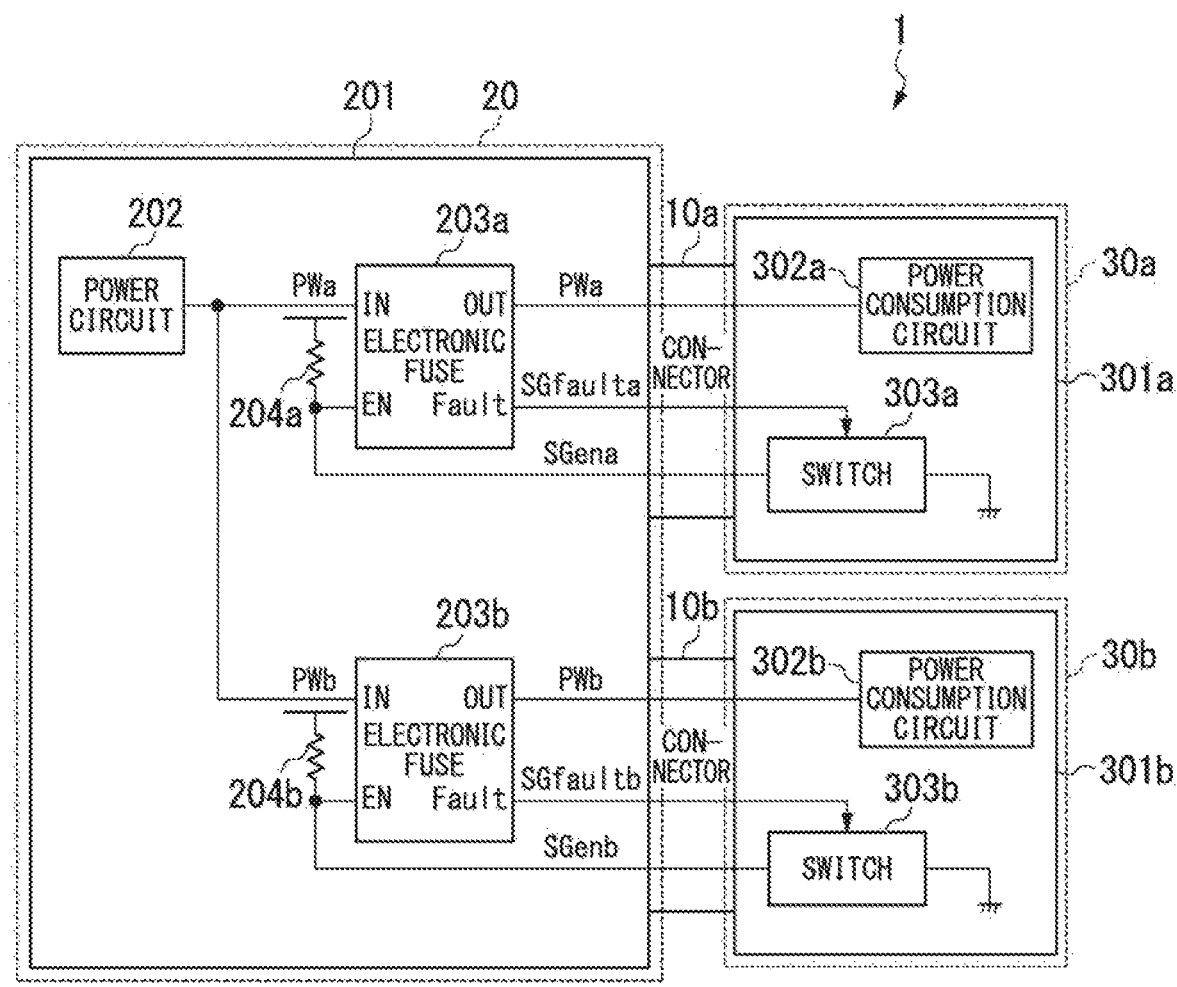
FIG. 3 is a block diagram showing a minimum configuration of a power supply system according to the present invention.

Next, the minimum configuration of the power supply system 1 according to the present invention will be described with reference to FIG. 3. In FIG. 3, the same constituent elements as those shown in FIG. 1 will be denoted using the same reference signs. The power supply system 1 shown in FIG. 3 includes the first circuit board 201, the second circuit boards 301a, 301b, and the connectors 10a, 10b connecting between the first circuit board 201 and the second circuit boards 301a, 301b. The first circuit board 201 includes the power source circuit 202 and the electronic fuses 203a, 203b. The electronic fuses 203a and 203b supply power from the power source circuit 202 to the second circuit boards 301a and 301b based on the voltage applied to the enable terminal EN (or a first terminal) while generating a fault signal (or a predetermined signal) at the fault terminal Fault (or a second terminal) according to an amount of current flowing through the internal circuit. The second circuit boards 301a, 301b include the power consumption circuits 302a, 302b configured to consume power from the power source circuit 202, and the switches 303a, 303b. The switches 303a and 303b hold the other connected state responsive to a fault signal (or a predetermined signal) occurring at the fault terminal Fault of the electronic fuses 203a, 203b when the current connected state is changed to the other connected state (e.g. a change from the open state to the short-circuited state).

Figure 4:
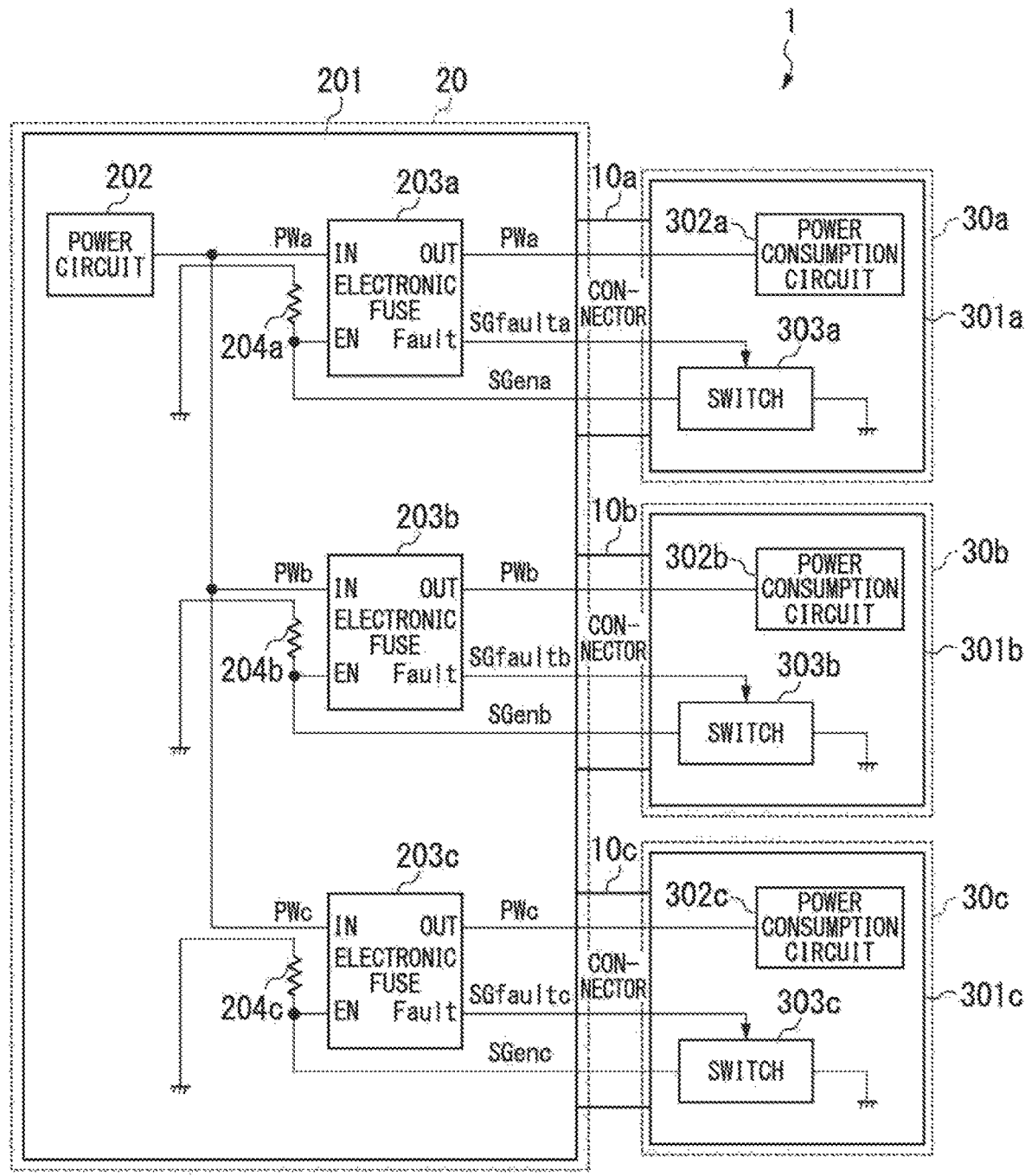
FIG. 4 is a block diagram of a power supply system according to a first variation of one embodiment of the present invention.
Figure 5:
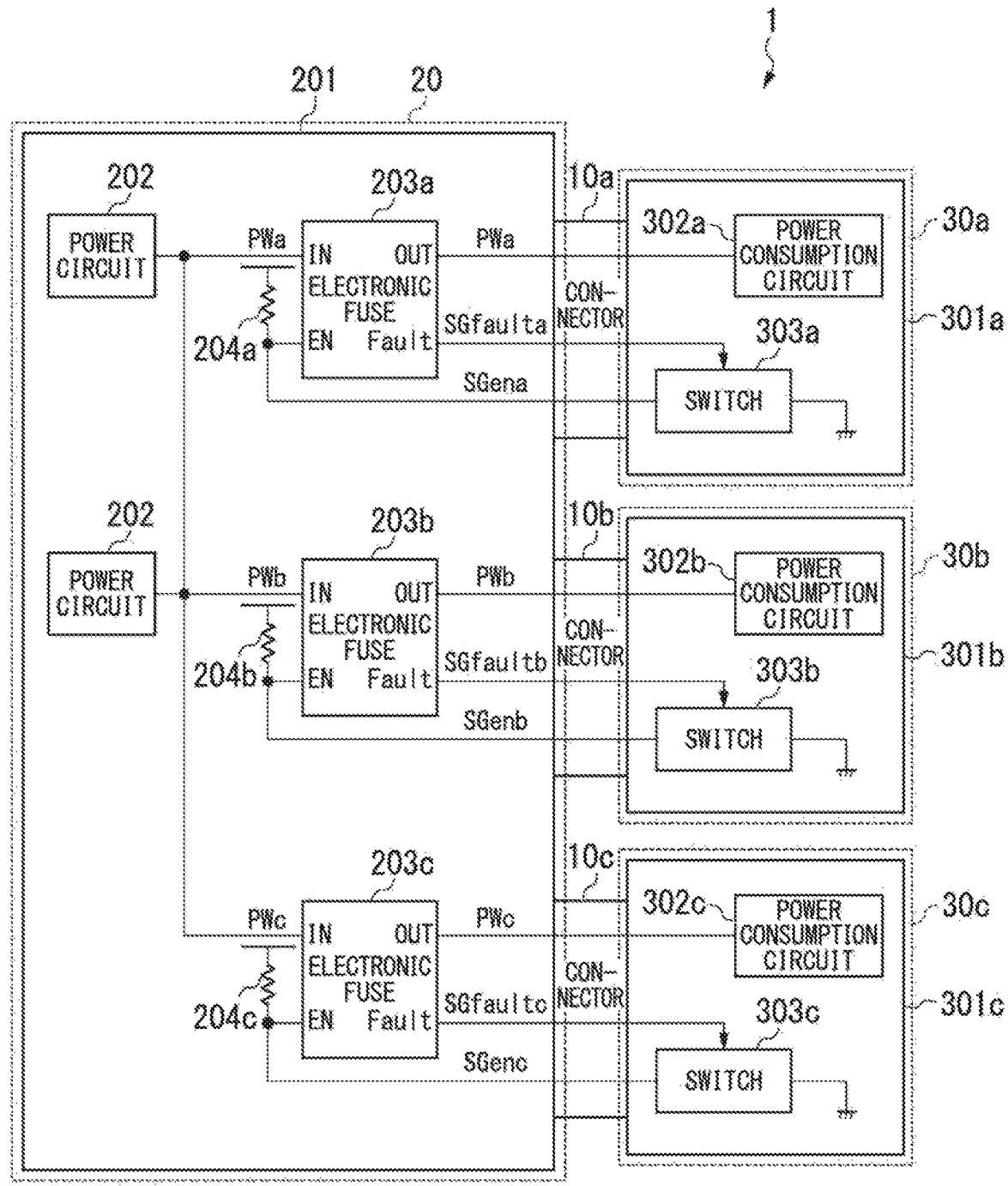
FIG. 5 is a block diagram of a power supply system according to a second variation of one embodiment of the present invention.

FIGS. 4 and 5 are block diagrams showing the power supply system 1 according to variations of one embodiment of the present invention. Herein, the same constituent elements as those shown in FIG. 1 will be denoted using the same reference signs, and therefore their descriptions will be omitted here.

The electronic fuse 203 may be in an operable condition when the enable terminal thereof is pulled down. In this case, the resistor 204 is a pull-down resistor in the power supply system 1 shown in FIG. 4. Upon receiving a fault signal from the electronic fuse 203, the switch 303 establishes a short-circuited state between the power output terminal and the enable terminal EN of the electronic fuse 203.

Upon detecting an overcurrent with the internal circuit, the electronic fuse 203 may cut out the internal circuit between the input terminal IN and the output terminal OUT irrespective of the condition of the enable terminal EN.

Alternatively, as shown in FIG. 5, the first circuit board 201 of the power supply system 1 may include a plurality of power source circuits 202.

In this connection, it is possible to dispose a memory or a storage device (e.g. a resistor or the like) which is installed in the switch 303 at any position in the power supply system as long as they can appropriately receive or transmit information. In addition, it is possible to provide a plurality of memories or storage devices configured to store data in a dispersive manner as long as they can appropriately receive or transmit information.

In addition, it is possible to change the order of processes of a power supply system (e.g. the procedure shown in FIG. 2) as long as an overcurrent protection process can be secured.

The present invention has been described with reference to examples which are illustrative and not restrictive; hence, the present invention should not be limited to the foregoing embodiment. In addition, it is possible to appropriately omit, change, or replace some of the constituent elements and processes without departing from the essence of the invention as defined in the appended claims.

INDUSTRIAL APPLICABILITY

The present invention is directed to power supply systems, control methods of power supply systems, and circuit boards which can be applied to various types of electric appliances and electronic devices. In addition, the present invention is applicable to other types of devices such as communication devices and vehicles.

REFERENCE SIGNS LIST 1 power supply system
10, 10a, 10b, 10c connector
20, 30, 30a, 30b, 30c module
201 first circuit board
301, 301a, 301b, 301c second circuit board
202 power source circuit
203, 203a, 203b, 203c electronic fuse
204, 204a, 204b, 204c resistor
302, 302a, 302b, 302c power consumption circuit
303, 303a 303b, 303c switch

What is claimed is:

1. A power supply system comprising:
a power source circuit;
an electronic fuse having an input terminal connected to the power source circuit and an output terminal configured to output power supplied by the power source circuit;
a power consumption circuit connected to the output terminal of the electronic fuse; and
a switch interposed between ground and a first terminal of the electronic fuse configured to enable a conducted state between the input terminal and the output terminal of the electronic fuse,
wherein the power source circuit and the electronic fuse are mounted on a first circuit board while the power source circuit and the switch are mounted on a second circuit board such that the first circuit board is connected to the second circuit board through a connector, and
wherein upon detecting an overcurrent, the electronic fuse outputs a fault signal at a second terminal thereof toward the switch so as to turn on the switch and to establish a short-circuited state between the ground and the first terminal of the electronic fuse, thus establishing a cutout state between the input terminal and the output terminal of the electronic fuse.

2. The power supply system according to claim 1, wherein the switch includes a non-volatile memory area, which is configured to hold a value according to the fault signal generated at the second terminal of the electronic fuse and to thereby hold with the cutout state of the electronic fuse.

3. A control method applied to a power supply system including a power source circuit, an electronic fuse having an input terminal connected to the power source circuit and an output terminal configured to output power supplied by the power source circuit, a power consumption circuit connected to the output terminal of the electronic fuse, and a switch interposed between ground and a first terminal of the electronic fuse configured to enable a conducted state between the input terminal and the output terminal of the electronic fuse, the control method comprising:
upon detecting an overcurrent with the electronic fuse, outputting a fault signal at a second terminal of the electronic fuse toward the switch;
turning on the switch to establish a short-circuited state between the ground and the first terminal of the electronic fuse; and
establishing a cutout state between the input terminal and the output terminal of the electronic fuse.

* * * * *